United States Patent
Seo et al.

(10) Patent No.: US 12,439,639 B2
(45) Date of Patent: Oct. 7, 2025

(54) THIN FILM TRANSISTOR ARRAY SUBSTRATE INCLUDING EDGE REGION CAPPING CONDUCTIVE REGION

(71) Applicant: Samsung Display Co., Ltd., Yongin-Si (KR)

(72) Inventors: Jong Oh Seo, Seoul (KR); Hiroshi Okumura, Hwaseong-si (KR); Jae Woo Jeong, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 516 days.

(21) Appl. No.: 17/689,019

(22) Filed: Mar. 8, 2022

(65) Prior Publication Data

US 2023/0132252 A1   Apr. 27, 2023

(30) Foreign Application Priority Data

Oct. 27, 2021   (KR) .................. 10-2021-0144459

(51) Int. Cl.
*H10D 30/67* (2025.01)
*H10D 30/01* (2025.01)
(Continued)

(52) U.S. Cl.
CPC ..... *H10D 30/6731* (2025.01); *H10D 30/0314* (2025.01); *H10D 30/0321* (2025.01);
(Continued)

(58) Field of Classification Search
CPC ......... H01L 29/78675; H01L 29/78696; H01L 29/78684; H01L 29/78618;
(Continued)

(56) References Cited

U.S. PATENT DOCUMENTS 5,264,383 A * 11/1993 Young .................. H01L 21/0274
257/E29.279
5,396,099 A * 3/1995 Kitajima ............ H10D 30/6757
257/E21.414
(Continued)

FOREIGN PATENT DOCUMENTS

JP   H11-243212 A   9/1999
KR   10-2017-0080996 A   7/2017
(Continued)

OTHER PUBLICATIONS

Andrey V. Miakonkikh, et al. "Carbon and fluorine co-implantation for boron diffusion suppression in extremely ultra shallow junctions," Proc. of SPIE, International Conference on Micro- and Nano-Electronics 2014, 2014, pp. 94400L-1 thru 94400L-5, vol. 9440, SPIE.

*Primary Examiner* — Ida M Soward
(74) *Attorney, Agent, or Firm* — Innovation Counsel LLP

(57) ABSTRACT

A transistor substrate includes a substrate, a semiconductor layer overlapping the substrate, and a gate electrode overlapping the semiconductor layer. The semiconductor layer includes a channel unit, a conductive unit directly connected to an end of the channel unit, and an edge unit positioned at an edge of the conductive unit. A carbon concentration of the edge unit is higher than each of a carbon concentration of the channel unit and a carbon concentration of the conductive unit.

16 Claims, 18 Drawing Sheets

(51) Int. Cl.
*H10D 86/01* (2025.01)
*H10D 86/40* (2025.01)
*H10D 86/60* (2025.01)

(52) U.S. Cl.
CPC ..... *H10D 30/6745* (2025.01); *H10D 30/6757* (2025.01); *H10D 86/0221* (2025.01); *H10D 86/0231* (2025.01); *H10D 86/421* (2025.01); *H10D 86/60* (2025.01); *H10D 30/6746* (2025.01)

(58) Field of Classification Search
CPC ......... H01L 29/78648; H01L 29/78666; H01L 27/1222; H10D 30/6731; H10D 30/6745; H10D 30/6757; H10D 30/6746; H10D 30/6741; H10D 30/6734; H10D 30/6713; H10D 86/421; H10D 86/60
See application file for complete search history.

(56) References Cited

U.S. PATENT DOCUMENTS

| | | | |
|---|---|---|---|
| 5,581,092 A | 12/1996 | Takemura | |
| 6,548,331 B2 * | 4/2003 | Lee | H10D 30/6706 438/149 |
| 7,608,490 B2 * | 10/2009 | Yamazaki | H01L 21/02683 438/149 |
| 8,008,693 B2 * | 8/2011 | Yamazaki | H01L 21/02532 257/288 |
| 8,541,781 B2 * | 9/2013 | Noda | H10D 30/6757 257/43 |
| 8,952,379 B2 * | 2/2015 | Yamazaki | H10D 30/6756 257/43 |
| 10,032,932 B2 | 7/2018 | Kim et al. | |
| 12,016,203 B2 * | 6/2024 | Kim | H10K 59/12 |
| 2003/0094611 A1 * | 5/2003 | Hayakawa | H01L 27/1277 257/E27.111 |
| 2005/0104065 A1 | 5/2005 | Yamazaki et al. | |
| 2007/0018236 A1 * | 1/2007 | Tsuchiaki | H10D 62/116 257/E29.147 |
| 2007/0054442 A1 * | 3/2007 | Liu | H10D 30/0314 257/E29.147 |
| 2009/0045461 A1 | 2/2009 | Droes et al. | |
| 2010/0291740 A1 | 11/2010 | Makita | |
| 2012/0161122 A1 * | 6/2012 | Yamazaki | H01L 29/7869 257/43 |
| 2013/0069055 A1 * | 3/2013 | Yamazaki | H01L 29/78693 257/43 |
| 2015/0102410 A1 * | 4/2015 | Liu | H10D 30/795 438/151 |
| 2015/0236285 A1 * | 8/2015 | Afzali-Ardakani | G06N 3/063 257/24 |
| 2019/0273165 A1 * | 9/2019 | Hekmatshoartabari | H01L 21/02579 |
| 2021/0328074 A1 * | 10/2021 | Kobayashi | H01L 29/78696 |
| 2021/0328163 A1 * | 10/2021 | Huang | H10K 85/221 |
| 2022/0190142 A1 | 6/2022 | Jeong et al. | |

FOREIGN PATENT DOCUMENTS

| | | |
|---|---|---|
| KR | 10-2017-0093065 A | 8/2017 |
| KR | 10-2019-0068154 A | 6/2019 |
| KR | 10-2020-0121941 A | 10/2020 |
| KR | 10-2022-0085070 A | 6/2022 |

* cited by examiner

THIN FILM TRANSISTOR ARRAY SUBSTRATE INCLUDING EDGE REGION CAPPING CONDUCTIVE REGION

CROSS-REFERENCE TO RELATED APPLICATION

This application claims priority to and the benefit of Korean Patent Application No. 10-2021-0144459 filed in the Korean Intellectual Property Office on Oct. 27, 2021; the Korean Patent Application is incorporated by reference.

BACKGROUND (a) Technical Field

The technical field relates to a thin film transistor array substrate and a method for manufacturing the thin film transistor array.

(b) Description of the Related Art

An electronic device, such as a display device, may include a thin film transistor array substrate that includes thin film transistors for performing switching functions and/or for controlling electronic elements. A display device may include thin film transistors positioned in a display area and may include thin film transistors positioned in a peripheral area.

A thin film transistor typically includes a semiconductor layer and a gate electrode. A gate insulating layer is positioned between the semiconductor layer and the gate electrode.

SUMMARY

Embodiments may be related to a thin film transistor array substrate including thin film transistors that may prevent unnecessary diffusion of a dopant or impurity, such that unwanted deviation of characteristics of the thin film transistors may be minimized. Advantageously, the performance of the thin film transistors may be sufficiently consistent and/or uniform. Embodiments may be related to a method for manufacturing the thin film transistor array substrate.

An embodiment may be related to a thin film transistor array substrate that includes the following elements: a substrate; a semiconductor layer on the substrate; and a gate electrode on the semiconductor layer, wherein the semiconductor layer includes a channel region, conductive regions positioned on both sides of the channel region, and an edge portion; the edge portion is positioned at an edge of the conductive region; and the edge portion is doped with high concentration of carbon compared with the channel region and the conductive region.

The edge portion may include a vertical portion that extends in a first direction perpendicular to a surface of the substrate and contacts a side surface of the conductive region.

The edge portion may further include a horizontal portion that extends in a second direction different from the first direction and contacts an upper surface of the conductive region.

The vertical portion and the horizontal portion may be connected to each other at corners thereof.

One side surface of the horizontal portion is in contact with one side surface of the channel region.

A width of the horizontal portion in the first direction may be smaller than a length of the vertical portion in the first direction, and a length of the horizontal portion in the second direction may be larger than a width of the vertical portion in the second direction.

The thin film transistor array substrate may further include: an insulating layer positioned on the gate electrode; and an electrode positioned on the insulating layer, wherein the electrode may contact an upper surface of the horizontal portion of the edge portion through an opening formed in the insulating layer to be electrically connected thereto.

The thin film transistor array substrate may further include an insulating layer positioned between the semiconductor layer and the gate electrode, wherein a lower portion of the insulating layer may be doped with carbon and may include an additional horizontal portion contacting the horizontal portion.

The semiconductor layer may further include a bottom portion that is positioned thereunder and is doped with carbon having a higher concentration than that of the channel region and the conductive region.

The edge portion and the bottom portion together may surround bottom and side surfaces of the semiconductor layer, and an entire upper surface of the semiconductor layer excluding an upper surface of the channel region.

The edge portion may be conductive.

The semiconductor layer may include polycrystalline silicon.

An embodiment may be related to a method for manufacturing a thin film transistor array substrate. The method may include the following steps: forming a semiconductor layer on a substrate; forming a first mask pattern on the semiconductor layer to expose an edge portion of the semiconductor layer; primarily doping carbon in the semiconductor layer by using the first mask pattern as a mask; removing the first mask pattern, and doping an impurity in the exposed semiconductor layer; and forming a first insulating layer on the semiconductor layer.

The manufacturing method of the thin film transistor array substrate may further include forming a second mask pattern on the first insulating layer; and secondarily doping carbon in the semiconductor layer by using the second mask pattern as a mask.

The manufacturing method of the thin film transistor array substrate may further include: removing the first insulating layer; forming a second insulating layer on the semiconductor layer; and forming a gate electrode on the second insulating layer.

The manufacturing method of the thin film transistor array substrate may further include: forming a gate electrode on the first insulating layer; and secondarily doping carbon in the semiconductor layer by using the gate electrode as a mask.

The manufacturing method of the thin film transistor array substrate may further include: forming a second insulating layer on the gate electrode; forming an opening in the second insulating layer and the first insulating layer; and forming an electrode connected to the semiconductor layer through the opening.

The manufacturing method of the thin film transistor array substrate may further include forming a bottom portion doped with carbon in a lower portion of the semiconductor layer by injecting carbon into the lower portion of the semiconductor layer.

An embodiment may be related to a method for manufacturing a thin film transistor array substrate. The method may include the following steps: stacking amorphous silicon on a substrate to form a first semiconductor layer; forming a lower doped layer by primarily doping carbon in a lower portion of the first semiconductor layer by injecting carbon from a lower part of the substrate; stacking amorphous silicon on the first semiconductor layer to form an additional semiconductor layer; forming a first mask pattern exposing an edge portion of a second semiconductor layer on the second semiconductor layer including the lower doped layer, the first semiconductor layer, and the additional semiconductor layer; primarily doping carbon in the second semiconductor layer by using the first mask pattern as a mask; removing the first mask pattern, and doping an impurity in the exposed second semiconductor layer; and forming a first insulating layer on the second semiconductor layer.

The manufacturing method of the thin film transistor array substrate may further include: forming a second mask pattern on the first insulating layer; and secondarily doping carbon in the semiconductor layer by using the second mask pattern as a mask.

An embodiment may be related to a thin film transistor array substrate that includes the following elements: a channel region; a first region doped with a first material; and a second region doped with a second material, wherein the first region is in contact with the channel region to be positioned at both ends of the channel region, and the second region overlaps the first region and is in contact with the channel region.

The first material may include boron.

The second material may include carbon.

An embodiment may be related to a transistor substrate. The transistor substrate may include a substrate, a semiconductor layer overlapping the substrate, and a gate electrode overlapping the semiconductor layer. The semiconductor layer may include a channel region, a conductive region directly connected to an end of the channel region, and an edge portion positioned at an edge of the conductive region. A carbon concentration of the edge portion may be higher than each of a carbon concentration of the channel region and a carbon concentration of the conductive region.

The edge portion may include a first member directly contacting a first face of the conductive region. The conductive region may be positioned between the first member and the channel region.

The edge portion may include a second member directly contacting a second face of the conductive region. The conductive region may be positioned between the second member and the substrate.

The first member and the second member may be directly connected to each other.

The second member may directly contact the channel region.

A first dimension of the second member in a direction perpendicular to the substrate may be smaller than a first dimension of the first member in the direction perpendicular to the substrate. A second dimension of the second member in a direction parallel to the substrate may be larger than a second dimension of the first member in the direction parallel to the substrate.

The transistor substrate may include the following elements: an insulating layer positioned on the gate electrode and including an opening; and an electrode partially positioned on the insulating layer, partially positioned inside the opening, and directly contacting the second member of the edge portion.

The transistor substrate may include an insulating layer. The insulating layer may be positioned between the semiconductor layer and the gate electrode and may include a carbon-doped portion that directly contacts the second member.

The semiconductor layer may include an intermediate portion positioned between the substrate and the channel region. A carbon concentration of the intermediate portion may be higher than each of the carbon concentration of the channel region and the carbon concentration of the conductive region.

The channel region, the edge portion, and the intermediate portion together may surround the conductive region. The intermediate portion may directly contact an entire face of the channel region.

The edge portion may be electrically conductive.

The semiconductor layer may include polycrystalline silicon.

An embodiment may be related to a method for manufacturing a transistor substrate. The method may include the following steps: providing a semiconductor layer on a substrate; providing a first mask on the semiconductor layer, wherein the first mask may expose an edge of the semiconductor layer; doping a first set of carbon in the semiconductor layer, which may be partially covered by the first mask; removing the first mask, and subsequently doping an impurity in the semiconductor layer; and forming a first insulating layer on the semiconductor layer.

The method may include the following steps: providing a second mask on the first insulating layer; and doping a second set of carbon in the semiconductor layer, which may be partially covered by the second mask.

The method may include the following steps: removing the first insulating layer; forming a second insulating layer on the semiconductor layer; and forming a gate electrode on the second insulating layer.

The method may include the following steps: forming a gate electrode on the first insulating layer; and doping a second set of carbon in the semiconductor layer, which may be partially covered by the gate electrode.

The method may include the following steps: forming a second insulating layer on the gate electrode; forming an opening in the second insulating layer and the first insulating layer; and forming an electrode connected to the semiconductor layer through the opening.

The method may include forming a carbon-containing portion in the semiconductor layer by injecting a second set of carbon through the substrate to the semiconductor layer.

An embodiment may be related to a method for manufacturing a transistor substrate. The method may include the following steps: providing a first semiconductor layer on a substrate, wherein the first semiconductor layer may include a first set of amorphous silicon; forming a carbon-containing portion in the first semiconductor layer by injecting a first set of carbon through the substrate to the first semiconductor layer; providing a second semiconductor layer on the first semiconductor layer, wherein the first semiconductor layer may include the carbon-containing portion, wherein the second semiconductor layer may include a second set of amorphous silicon, and wherein a combined semiconductor layer may include the first semiconductor layer and the second semiconductor layer; providing a first mask on the combined semiconductor layer; doping a second set of carbon in the combined semiconductor layer, which may be partially covered by the first mask; removing the first mask, and subsequently doping an impurity in the combined semiconductor layer; and forming a first insulating layer on the combined semiconductor layer.

The method may include the following steps: forming a second mask on the first insulating layer; and doping a third set of carbon in the combined semiconductor layer, which may be partially covered by the second mask.

An embodiment may be related to a transistor substrate. The transistor substrate may include a channel region, a first region, and a second region. The first region may be doped with a first material and may directly contact an end (face) of the channel region. The second region may be doped with a second material different from the first material, may overlap the first region, and may directly contact the end (face) of the channel region.

The first material may include/be boron.

The second material may include/be carbon.

Embodiments may prevent a dopant or impurity from undesirably diffusing into a thin film transistor or a thin film transistor array. Advantageously, characteristics and/or performance of thin film transistors may be sufficiently consistent and/or uniform.

DETAILED DESCRIPTION OF EMBODIMENTS

Figure 1:
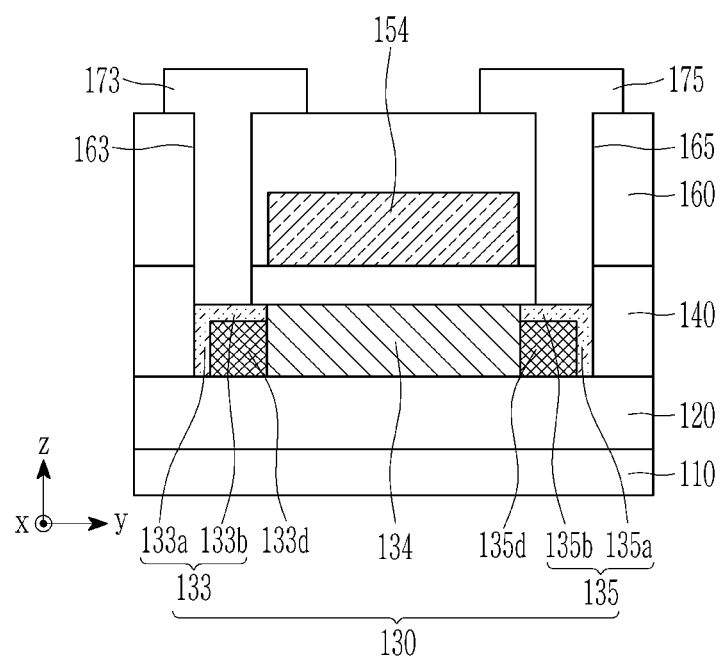
FIG. 1 illustrates a cross-sectional view of a thin film transistor array substrate according to an embodiment.

Examples of embodiments are described with reference to the accompanying drawings. The described embodiments may be modified in various ways. Identical or similar elements may be denoted by the same reference numerals.

In the drawings, dimensions may be exaggerated for clarity.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

When a first element is referred to as being "on" a second element, the first element can be directly on the second element, or one or more intervening elements may be present between the first element and the second element. When a first element is referred to as being "directly on" a second element, there are no intended intervening elements (except for environmental elements such as air) present between the first element and the second element.

Unless explicitly described to the contrary, the word "comprise" and variations such as "comprises" or "comprising" may indicate the inclusion of stated elements but may not indicate the exclusion of any other elements.

A cross-sectional/plan view of an item may mean a cross-sectional/plan view of a portion of the item. The term "connect" may mean "directly connect" or "indirectly connect." The term "connect" may mean "mechanically connect" and/or "electrically connect." The term "connected" may mean "electrically connected" or "electrically connected through no intervening transistor." The term "insulate" may mean "electrically insulate" or "electrically isolate." The term "conductive" may mean "electrically conductive." The term "drive" may mean "operate" or "control." The term "include" may mean "be made of." The term "adjacent" may mean "immediately adjacent." The expression that an element extends in a particular direction may mean that the element extends lengthwise in the particular direction and/or that the lengthwise direction of the element is in the particular direction. The term "pattern" may mean "member." The term "defined" may mean "formed" or "provided." The expression that a space or opening overlaps an object may mean that (the position of) the space or opening overlaps with (the position of) the object. The term "overlap" may be equivalent to "be overlapped by." The expression that a first element overlaps with a second element in a plan view may mean that the first element overlaps the second element in direction perpendicular to a substrate. The term "portion" may mean "unit"

or "member." The term "region" may mean "unit" or "member." The term "surface" may mean "face," "flat surface," or "flat face."

Figure 2:
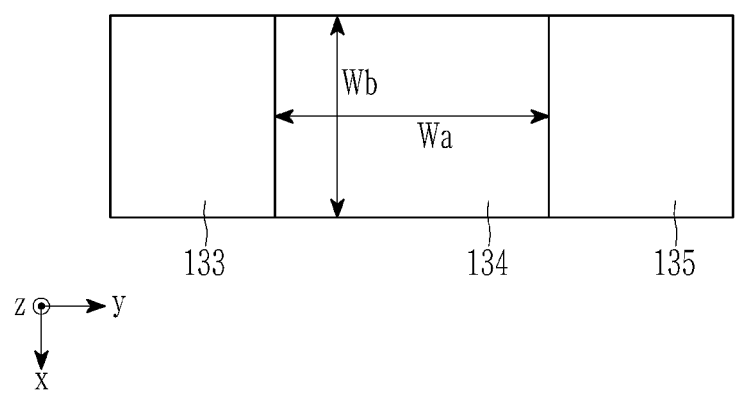
FIG. 2 illustrates a top plan view of a thin film transistor according to an embodiment.

FIG. 1 illustrates a cross-sectional view of a thin film transistor array substrate according to an embodiment. FIG. 2 illustrates a top plan view of the thin film transistor according to an embodiment.

Referring to FIG. 1, the thin film transistor array substrate includes a substrate 110, a buffer layer 120, a semiconductor layer 130, a gate electrode 154, a first electrode 173, a second electrode 175, first insulating layer 140, and a second insulating layer 160. The substrate 110 may include an insulating material. The buffer layer 120 may be an insulating layer and may be positioned on the substrate 110. The semiconductor layer 130 is positioned on the buffer layer 120.

The semiconductor layer 130 includes a channel region 134 for forming a channel when the thin film transistor is turned on, conductive regions 133$d$ and 135$d$ positioned at opposite sides of the channel region 134, and edge portions 133 and 135.

With respect to the channel region 134, a first conductive region 133$d$ positioned at one side may be a source region, and a second conductive region 135$d$ positioned at the other side may be a drain region; or vice versa.

The edge portions 133 and 135 have a higher concentration of doped carbon (C) compared with the remaining portions of the semiconductor layer 130, including the channel region 134 and the conductive regions 133$d$ and 135$d$. In the semiconductor layer 130, carbon may not be substantially doped in the channel region 134 and the conductive regions 133$d$ and 135$d$, but only the edge portions 133 and 135 may be substantially doped with carbon.

A dose of carbon doped in the edge portions 133 and 135 may be in a range of about $1*e^{11}/cm^2$ to $1*e^{13}/cm^2$.

The conductive regions 133$d$ and 135$d$ and the edge portions 133 and 135 may all be conductive, and may have a higher carrier concentration than the channel region 134. Accordingly, the edge portions 133 and 135 may be considered as being included in the conductive regions 133$d$ and 135$d$.

The first edge portion 133 may be positioned at an edge of the first conductive region 133$d$, and the second edge portion 135 may be positioned at an edge of the second conductive region 135$d$.

The first edge portion 133 may include a first vertical portion 133$a$ extending (and/or oriented) in a direction perpendicular to a surface of the substrate 110, that is, in a z-direction, and contacting a side surface of the first conductive region 133$d$. The first edge portion 133 may include a first horizontal portion 133$b$ extending (and/or oriented) in a y-direction perpendicular to the z-direction and contacting an upper surface of the first conductive region 133$d$. The first conductive region 133$d$ may be positioned between the first vertical portion 133$a$ and the channel region 134 and between the first horizontal portion 133$b$ and the substrate 110.

The first vertical portion 133$a$ and the first horizontal portion 133$b$ may be connected to each other a corner of the semiconductor layer 130. One side surface of the first horizontal portion 133$b$ may directly contact one side surface of the channel region 134.

The first vertical portion 133$a$ and the first horizontal portion 133$b$ connected to each other may substantially form a Hangul consonant 'ㄱ' shape in a yz cross-sectional view.

A y-directional length of the first horizontal portion 133$b$ may be larger than a y-directional width of the first vertical portion 133$a$. A z-directional thickness of the first horizontal portion 133$b$ may be smaller than a z-directional length of the first vertical portion 133$a$. For example, a z-directional thickness of the first horizontal portion 133$b$ may be in a range of about 1 angstrom to 50 angstroms. A y-directional width of the first vertical portion 133$a$ may be in a range of about 1 angstrom to 100 angstroms.

The second edge portion 135 may include a second vertical portion 135$a$ extending in a direction perpendicular to a surface of the substrate 110, that is, in the z-direction, and contacting a side surface of the second conductive region 135$d$. The second edge portion 135 may include a second horizontal portion 135$b$ extending in the y-direction and contacting an upper surface of the second conductive region 135$d$.

The second vertical portion 135$a$ and the second horizontal portion 135$b$ may be directly connected to each other at a corner of the semiconductor layer 130. The first horizontal portion 133$b$ and the second horizontal portion 135$b$ may respectively directly contact two opposite side surfaces of the channel region 134.

The second vertical portion 135$a$ and the second horizontal portion 135$b$ connected to each other may substantially form a Hangul consonant 'ㄱ' shape in a yz cross-sectional view.

A y-directional length of the second horizontal portion 135$b$ may be larger than a y-directional width of the second vertical portion 135$a$. A z-directional thickness of the second horizontal portion 135$b$ may be smaller than a z-directional length of the second vertical portion 135$a$. For example, a z-directional thickness of the second horizontal portion 135$b$ may be in a range of about 1 angstrom to 50 angstroms. A y-directional width of the second vertical portion 135$a$ may be in a range of about 1 angstrom to 100 angstroms.

Referring to FIG. 1 and FIG. 2, the edge portions 133 and 135 may include two opposite side surfaces of the semiconductor layer 130, and may include two opposite end parts of an upper surface of the semiconductor layer 30 at two opposite sides of the channel region 134. The edge portions 133 and 135 may include outer edges of the semiconductor layer 130 positioned at opposite sides of the channel region 134 of the semiconductor layer 130.

The semiconductor layer 130 may include a semiconductor material such as polycrystalline silicon, and the semiconductor layer 130 is entirely doped with an impurity other than carbon.

The semiconductor layer 130 may be a P-type semiconductor or an N-type semiconductor.

When the semiconductor layer 130 is a P-type semiconductor, a dopant (that is, an impurity) doped into the semiconductor layer 130 may include a group 13 element such as boron (B), aluminum (Al), or indium (In). When the semiconductor layer 130 is an N-type semiconductor, an impurity doped into the semiconductor layer 130 may include a group 15 element such as phosphorus (P), arsenic (As), or antimony (Sb). The semiconductor layer 130 may be doped with boron as a main impurity. In the description, the impurity doped in the semiconductor layer means an impurity other than carbon.

A dose of the impurity doped in the semiconductor layer 130 may be in a range of about $1*e^{11}/cm^2$ to $1*e^{13}$ $cm^2$.

A z-directional thickness of the semiconductor layer 130 may be in a range of about 400 angstroms to 500 angstroms.

The first insulating layer 140 may be disposed on the semiconductor 130. The first insulating layer 140 is also referred to as a gate insulating layer.

The gate electrode 154 may be positioned on the first insulating layer 140. The gate electrode 154 may overlap the channel region 134 of the semiconductor layer 130 in the z-direction.

The gate electrode 154 may not overlap the conductive regions 133d and 135d in the z-direction. The gate electrode 154 may not overlap the edge portions 133 and 135 in the z-direction.

The semiconductor layer 130 and the gate electrode 154 may form one thin film transistor. The thin film transistor array substrate includes a plurality of the thin film transistors.

The second insulating layer 160 may be positioned on the gate electrode 154.

At least one of the buffer layer 120, the first insulating layer 140, and the second insulating layer 160 may include an inorganic insulating material such as a silicon nitride ($SiN_x$), a silicon oxide ($SiO_x$), and/or a silicon oxynitride ($SiO_xN_y$) and/or may include an organic insulating material such as a polyimide, an acryl-based polymer, and/or a siloxane-based polymer.

A first electrode 173 and a second electrode 175 may be positioned on the second insulating layer 160.

The first electrode 173 may contact an upper surface of the first horizontal portion 133b of the first edge portion 133 of the semiconductor layer 130 through an opening 163 formed in the second insulating layer 160 and the first insulating layer 140 to be electrically connected to the first edge portion 133.

The second electrode 175 may contact an upper surface of the second horizontal portion 135b of the second edge portion 135 of the semiconductor layer 130 through an opening 165 formed in the second insulating layer 160 and the first insulating layer 140 to be electrically connected to the second edge portion 135.

At least one of the gate electrode 154, the first electrode 173, and the second electrode 175 may include at least one of copper (Cu), aluminum (Al), magnesium (Mg), silver (Ag), gold (Au), platinum (Pt), palladium (Pd), nickel, (Ni), neodymium (Nd), iridium (Ir), molybdenum (Mo), tungsten (W), titanium (Ti), chromium (Cr), tantalum (Ta), and an alloy of some of the above metal materials. Each of the gate electrode 154, the first electrode 173, and the second electrode 175 may be formed as a single layer or a multilayer structure.

In the semiconductor layer 130 of the thin film transistor, since the edge portions 133 and 135 additionally doped with carbon are positioned at sides and upper surface portions of the semiconductor layer 130 like walls, impurities such as boron doped in the semiconductor layer 130 are prevented from diffusing into elements outside the semiconductor layer 130 such as other thin film transistors. The carbon doped in the edge portions 133 and 135 may affect residual dangling bonds in the semiconductor layer 130 to prevent impurity diffusion. Accordingly, embodiments may minimize deviation of characteristics such as on/off ratios, threshold voltages, and leakage currents of the plurality of thin film transistors.

Referring to FIG. 2, when an electronic device, e.g., a display device, including the thin film transistor array substrate has high resolution, requires high-speed driving, and/or requires variable frequency driving, a short channel thin film transistor having a shorter channel length Wa of the thin film transistor is required. For example, each of the channel length Wa and a channel width Wb of the short channel thin film transistor may be in a range of about 1.5 micrometers to 2.0 micrometers.

As the channel length Wa of the thin film transistor becomes shorter, if not properly blocked, the impurities (such as boron) doped in the semiconductor layer 130 may diffuse beyond the semiconductor layer 130, so that there may be deviation of the characteristics of the thin film transistor. By blocking the impurities from diffusing beyond the semiconductor layer 130, embodiments may maintain substantially consistent characteristics of the thin film transistor. Advantageously, high-speed driving and variable frequency driving of electronic devices may be effectively realized, and characteristics of high-resolution display devices in which thin film transistors are disposed with high density may be satisfactory.

A method for manufacturing a thin film transistor array substrate according to one or more embodiments are described with reference to FIG. 3 to FIG. 6 together with the previously described FIG. 1 and FIG. 2.

Figure 3:
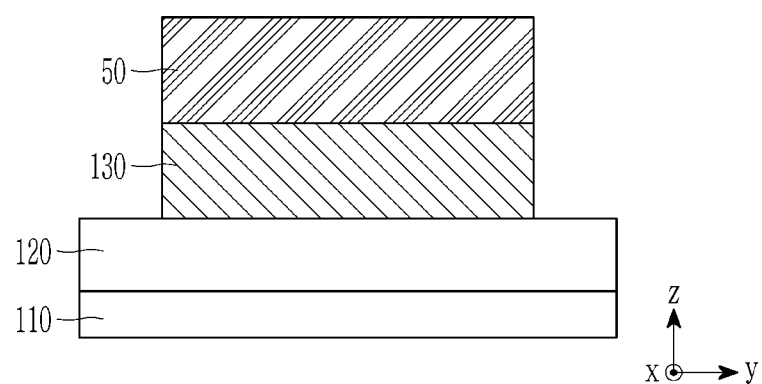
FIG. 3 illustrates a cross-sectional view of a structure corresponding to a process step in a method for manufacturing a thin film transistor array substrate according to an embodiment.
Figure 4:
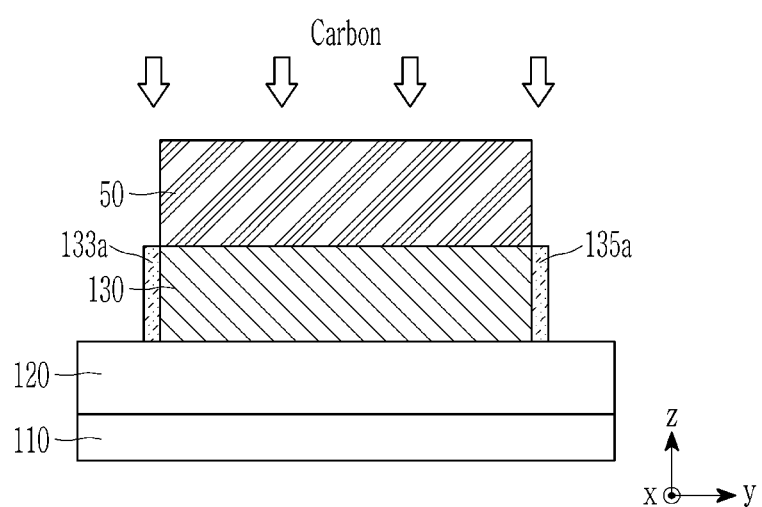
FIG. 4 illustrates a cross-sectional view of a structure corresponding to a step after the step shown in FIG. 3 according to an embodiment.
Figure 5:
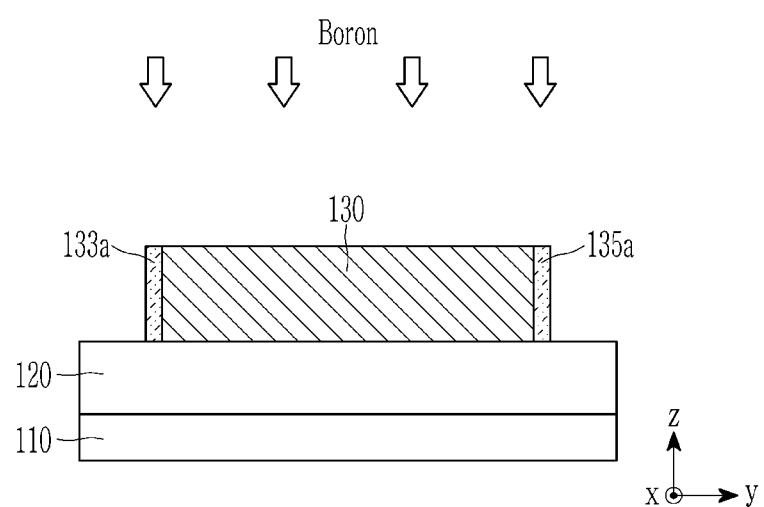
FIG. 5 illustrates a cross-sectional view of a structure corresponding to a step after the step shown in FIG. 4 according to an embodiment.
Figure 6:
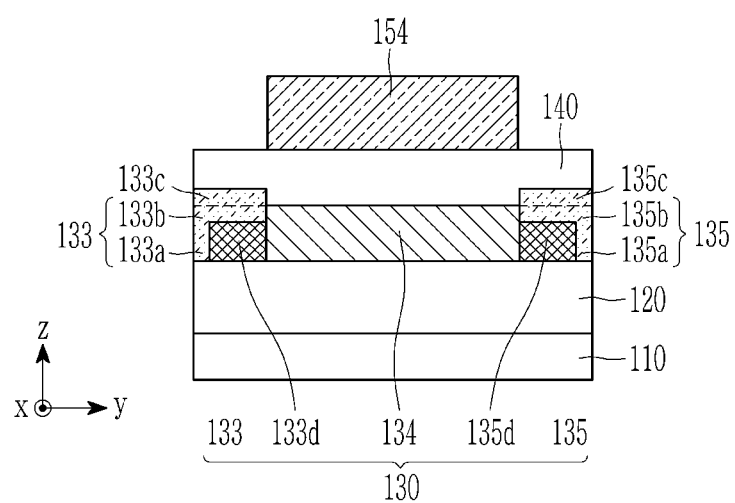
FIG. 6 illustrates a cross-sectional view of a structure corresponding to a step after the step shown in FIG. 5 according to an embodiment.

FIG. 3 illustrates a cross-sectional view of a structure corresponding to a process step of the method according to an embodiment. FIG. 4 illustrates a cross-sectional view of a structure corresponding to a step after the step shown in FIG. 3 according to an embodiment. FIG. 5 illustrates a cross-sectional view of a structure corresponding to a step after the step shown in FIG. 4 according to an embodiment. FIG. 6 illustrates a cross-sectional view of a structure (e.g., a thin film transistor array substrate) corresponding to a step after the step shown in FIG. 5 according to an embodiment.

Referring to FIG. 3, an insulating material, such as a silicon nitride ($SiN_x$) and/or a silicon oxide ($SiO_x$), is provided on the substrate 110 to form the buffer layer 120.

Subsequently, a semiconductor material layer is provided on the buffer layer 120, a mask pattern 50 is formed on the semiconductor material layer to partially cover the semiconductor material layer, and then the semiconductor material layer is etched or patterned using the mask pattern 50 as a mask to form the semiconductor layer 130.

When the semiconductor layer 130 includes polycrystalline silicon, amorphous silicon (a-Si) is first deposited on the buffer layer 120 to form an amorphous silicon layer, and the amorphous silicon layer is crystallized to form the polycrystalline silicon semiconductor layer 130. A crystallization method may include an annealing process using a heat source such as excimer laser.

The mask pattern 50 may include a photoresist.

Subsequently, referring to FIG. 4, side portions of the mask pattern 50 may be removed. For removing the side portions of the mask pattern 50, an ashing process using oxygen gas ($O_2$) may be performed. In this process, an upper portion of the mask pattern 50 may also be removed, so that a thickness of the mask pattern 50 in the z-direction may be reduced. A dimension of the mask pattern 50 in each of the x-direction, y-direction, and z-direction may be reduced by etching the mask pattern 50.

As a result, as shown in FIG. 4, edge portions of the semiconductor layer 130 are not covered by the mask pattern 50 and are exposed.

Subsequently, a set of carbon is primarily injected from above the mask pattern 50. Consequently, the edge portions of the semiconductor layer 130 exposed by the mask pattern 50 may be doped with carbon to form the first vertical portion 133a and the second vertical portion 135a. In a portion of the semiconductor layer 130 covered by the mask pattern 50, because the mask pattern 50 blocks carbon, carbon may hardly be doped.

During the carbon doping, a carbon acceleration voltage may be in a range of about 10 keV to 40 keV.

Subsequently, referring to FIG. 5, the mask pattern 50 is removed, and impurities such as boron are doped on the entire exposed semiconductor layer 130. Accordingly, the entire semiconductor layer 130 including the first vertical portion 133*a* and the second vertical portion 135*a* is doped with impurities such as boron. An acceleration voltage of boron during the doping may be in a range of about 1 keV to 10 keV.

Subsequently, referring to FIG. 6, the first insulating layer 140 is formed by providing an insulating material on the semiconductor layer 130, and a conductive material such as a metal is provided on the first insulating layer 140 and patterned to form the gate electrode 154. The gate electrode 154 overlaps a region designated to be a channel region in the semiconductor layer 130 and does not overlap edge portions of the semiconductor layer 130.

Subsequently, with the gate electrode 154 functioning as a mask, an impurity such as boron is injected from above the gate electrode 154 to form the conductive regions 133*d* and 135*d* at opposite sides of the channel region 134.

Subsequently, with the gate electrode 154 functioning as a mask, a set of carbon is secondarily injected from above the gate electrode 154. The region of the semiconductor layer 130 covered by the gate electrode 154 is blocked from being doped with carbon, and carbon may be doped on the upper edge portions of the semiconductor layer 130 not covered by the gate electrode 154 in the z-direction to form the first horizontal portion 133*b* and the second horizontal portion 135*b*.

A secondary carbon doping depth may be smaller than a primary carbon doping depth. Therefore, z-directional thicknesses of the first horizontal portion 133*b* and the second horizontal portion 135*b* are smaller than z-directional lengths of the first vertical portion 133*a* and the second vertical portion 135*a*. For this purpose, a secondary carbon doping concentration or time may be smaller than a primary carbon doping concentration or time.

Upper edge portions of the semiconductor layer 130 may be formed as the first horizontal portion 133*b* and the second horizontal portion 135*b* depending on a dose of the secondary carbon. Lower edge portions of the first insulating layer 140 contacting the upper surfaces of the first horizontal portion 133*b* and the second horizontal portion 135*b* may also be doped with carbon to form a first additional horizontal portion 133*c* and a second additional horizontal portion 135*c* shown in FIG. 6. The first additional horizontal portion 133*c* may be in contact with the first horizontal portion 133*b* and may be continuously formed with the first horizontal portion 133*b* in the z-direction, and the second additional horizontal portion 135*c* may be in contact with the second horizontal portion 135*b* and may be continuously formed with the second horizontal portion 135*b* in the z-direction. The first additional horizontal portion 133*c* and the second additional horizontal portion 135*c* may not overlap the gate electrode 154 in the z-direction.

The first additional horizontal portion 133*c* and the second additional horizontal portion 135*c* are included in the first insulating layer 140 and may be insulative.

Referring to FIG. 1, by adjusting the dose of the secondary carbon doping, the first additional horizontal portion 133*c* and the second additional horizontal portion 135*c* may not be formed.

The structure illustrated in FIG. 6 may represent a thin film transistor array substrate.

Subsequently, analogous to FIG. 1 described above, the second insulating layer 160 is formed by providing an insulating material on the gate electrode 154. Subsequently, openings 163 and 165 are formed by patterning the first insulating layer 140 and the second insulating layer 160. Subsequently, a conductive material such as a metal is provided on the second insulating layer 160 and patterned to form the first electrode 173 and the second electrode 175.

A method for manufacturing a thin film transistor array substrate according to one or more embodiments are described with reference to FIG. 7 to FIG. 9 together with some of the previously described drawings, particularly, FIG. 3 to FIG. 5.

Figure 7:
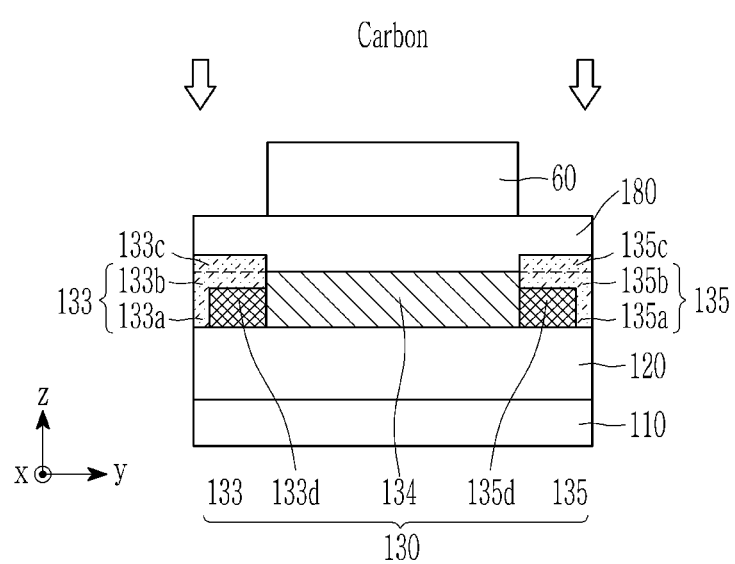
FIG. 7 illustrates a cross-sectional view of a structure corresponding to a step after the step shown in FIG. 5 according to an embodiment.
Figure 8:
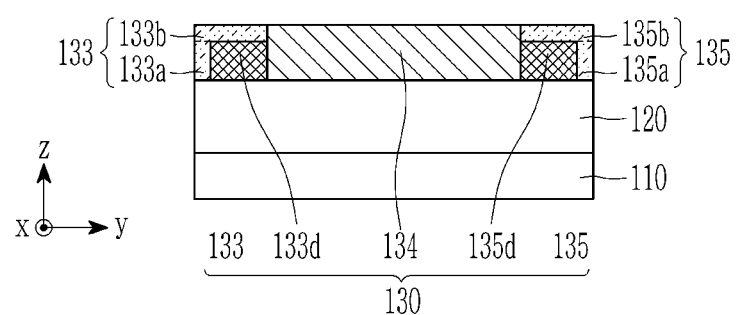
FIG. 8 illustrates a cross-sectional view of a structure corresponding to a step after the step shown in FIG. 7 according to an embodiment.

FIG. 7 illustrates a cross-sectional view of a structure corresponding to a step after the step shown in FIG. 5 according to an embodiment. FIG. 8 illustrates a cross-sectional view of a structure corresponding to a step after the step shown in FIG. 7 according to an embodiment. FIG. 9 illustrates a cross-sectional view of a structure corresponding to a step after the step shown in FIG. 8 according to an embodiment.

The method may include features that are identical to and/or similar to features described with reference to FIG. 3 to FIG. 6, but the process steps after the process step shown in FIG. 5 may be different.

With reference to FIG. 3 to FIG. 5, the entire semiconductor layer 130 including the first vertical portion 133*a* and the second vertical portion 135*a* is doped with an impurity such as boron. Subsequently, referring to FIG. 7, a passivation layer 180 is formed by providing an insulating material such as a silicon nitride ($SiN_x$), a silicon oxide ($SiO_x$), or a silicon oxynitride ($SiO_xN_y$) on the semiconductor layer 130.

A z-directional thickness of the passivation layer 180 may be in a range of about 200 angstroms to 1000 angstroms.

Subsequently, a mask pattern 60 is formed on the passivation layer 180. The mask pattern 60 overlaps a region designated to be a channel region in the semiconductor layer 130 and does not overlap edge portions of the semiconductor layer 130.

The mask pattern 60 may include inorganic material and/or an organic material, such as a metal and/or a photoresist.

Subsequently, with the mask pattern 60 functioning as a mask, an impurity such as boron is injected from above the mask pattern 60 to form the conductive regions 133*d* and 135*d* at opposite sides of the channel region 134.

Subsequently, with the mask pattern 60 functioning as a mask, a set of carbon is secondarily doped from above the mask pattern 60 (wherein primary carbon doping is the same as the step described with reference to FIG. 4). This secondary carbon doping may be performed under the same condition as the secondary carbon doping described above. Subsequently, the region of the semiconductor layer 130 overlapping the mask pattern 60 is blocked from being doped with carbon, and carbon may be doped on the upper edge portions of the semiconductor layer 130 not overlapped by the mask pattern 60 in the z-direction to form the first horizontal portion 133*b* and the second horizontal portion 135*b*.

When a z-directional thickness of the passivation layer 180 is adjusted, a secondary carbon doping depth may be controlled. During the secondary carbon doping, damage to the upper portion of the semiconductor layer 130 may be reduced by the passivation layer 180.

Upper edge portions of the semiconductor layer 130 may be formed as the first horizontal portion 133*b* and the second horizontal portion 135*b* depending on a dose of the secondary carbon. Lower edge portions of the passivation layer 180 contacting the upper surfaces of the first horizontal portion 133*b* and the second horizontal portion 135*b* may also be doped with carbon to form a first additional horizontal portion 133c and a second additional horizontal portion 135c shown in FIG. 7. The first additional horizontal portion 133c may be in contact with the first horizontal portion 133b and may be continuously formed with the first horizontal portion 133b in the z-direction, and the second additional horizontal portion 135c may be in contact with the second horizontal portion 135b and may be continuously formed with the second horizontal portion 135b in the z-direction. The first additional horizontal portion 133c and the second additional horizontal portion 135c may not overlap the mask pattern 60 in the z-direction.

Subsequently, referring to FIG. 8, the mask pattern 60 and the passivation layer 180 are removed using an etching process or the like. The first additional horizontal portion 133c and the second additional horizontal portion 135c may also be removed. Accordingly, the edge portions 133 and 135 illustrated in FIG. 1 described above may be formed.

Subsequently, referring to FIG. 9, the first insulating layer 140 is formed by providing an insulating material on the semiconductor layer 130, and a conductive material such as a metal is provided on the first insulating layer 140 and patterned to form the gate electrode 154.

Figure 9:
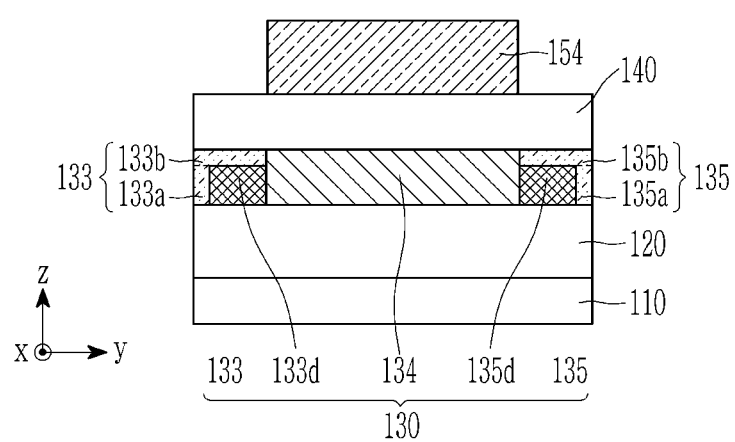
FIG. 9 illustrates a cross-sectional view of a structure corresponding to a step after the step shown in FIG. 8 according to an embodiment.

The structure illustrated in FIG. 9 may represent a thin film transistor array substrate.

Subsequently, referring to FIG. 1, the second insulating layer 160 is formed by providing an insulating material on the gate electrode 154. Subsequently, the openings 163 and 165 are formed by patterning the first insulating layer 140 and the second insulating layer 160. Subsequently, a conductive material such as a metal is provided on the second insulating layer 160 and patterned to form the first electrode 173 and the second electrode 175.

One or more methods for manufacturing a thin film transistor array substrate according to one or more embodiments are described with reference to FIG. 10 to FIG. 15 together with the previously described FIG. 3 and FIG. 6.

Figure 10:
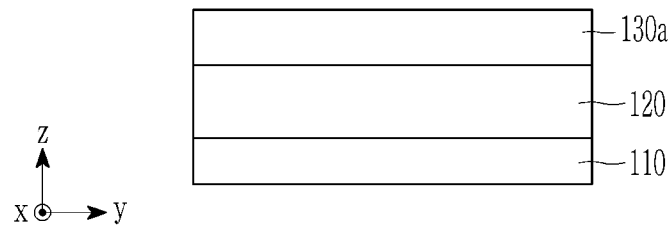
FIG. 10 illustrates a cross-sectional view of a structure corresponding to a process step of a method for manufacturing a thin film transistor array substrate according to an embodiment.
Figure 11:
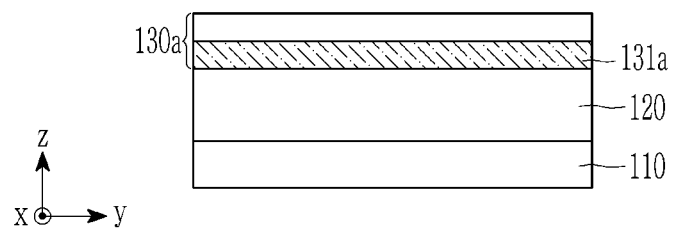
FIG. 11 illustrates a cross-sectional view of a structure corresponding to a step after the step shown in FIG. 10 according to an embodiment.
Figure 12:
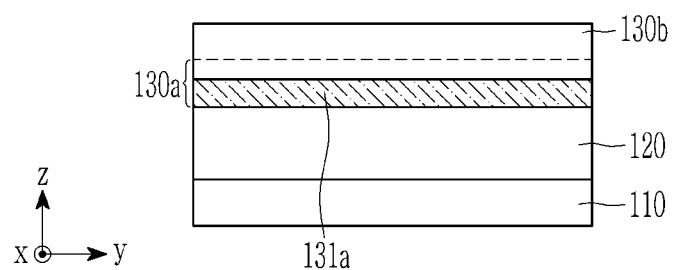
FIG. 12 illustrates a cross-sectional view of a structure corresponding to a step after the step shown in FIG. 11 according to an embodiment.
Figure 13:
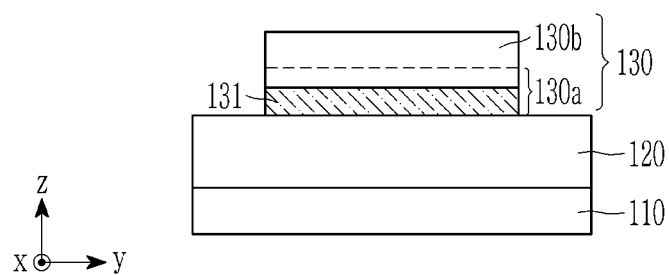
FIG. 13 illustrates a cross-sectional view of a structure corresponding to a step after the step shown in FIG. 12 according to an embodiment.
Figure 14:
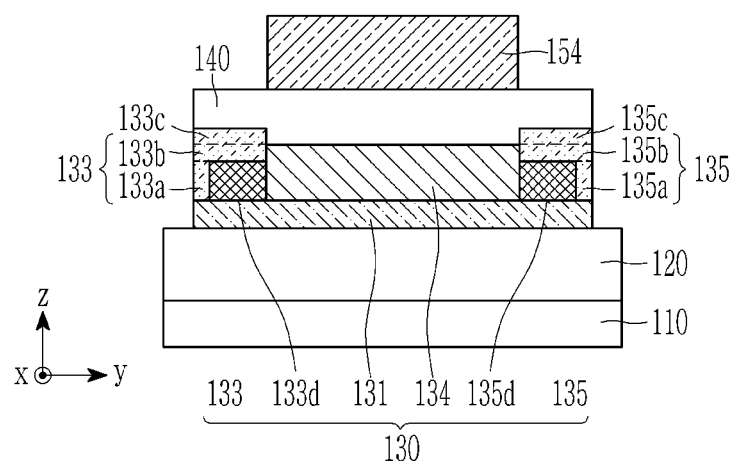
FIG. 14 illustrates a cross-sectional view of a structure corresponding to a step after the step shown in FIG. 13 according to an embodiment.
Figure 15:
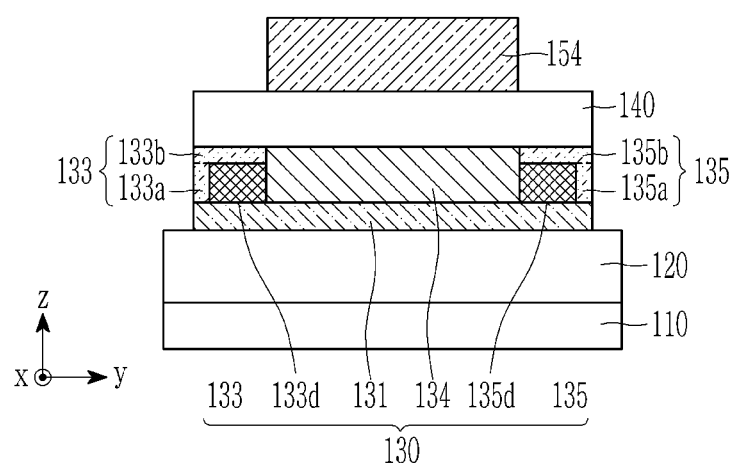
FIG. 15 illustrates a cross-sectional view of a structure corresponding to a step after the step shown in FIG. 13 according to an embodiment.

FIG. 10 illustrates a cross-sectional view of a structure corresponding to a process step of the method according to an embodiment. FIG. 11 illustrates a cross-sectional view of a structure corresponding to a step after the step shown in FIG. 10 according to an embodiment. FIG. 12 illustrates a cross-sectional view of a structure corresponding to a step after the step shown in FIG. 11 according to an embodiment. FIG. 13 illustrates a cross-sectional view of a structure corresponding to a step after the step shown in FIG. 12 according to an embodiment. FIG. 14 illustrates a cross-sectional view of a structure corresponding to a step after the step shown in FIG. 13 according to an embodiment. FIG. 15 illustrates a cross-sectional view of a structure corresponding to a step after the step shown in FIG. 13 according to an embodiment.

Referring to FIG. 10, an insulating material such as a silicon nitride ($SiN_x$) and/or a silicon oxide ($SiO_x$) is provided on the substrate 110 to form the buffer layer 120.

Subsequently, a semiconductor material layer such as an amorphous silicon (a-Si) layer is provided on the buffer layer 120 to form a semiconductor layer 130a.

Subsequently, referring to FIG. 11, carbon is injected from below the substrate 110 and through the substrate 110 to primarily dope carbon into at least a portion of a lower portion of the semiconductor layer 130a to form a doped layer 131a (or carbon-containing unit 131a) at the lower portion of the semiconductor layer 130a. Only the lower portion of the semiconductor layer 130a may be the doped layer 131a, or unlike the structure shown in FIG. 11, the entire semiconductor layer 130a may be doped with carbon to form the doped layer 131a.

Subsequently, referring to FIG. 12, an additional semiconductor layer 130b is formed by further providing a semiconductor material such as a material of the semiconductor layer 130a (e.g., amorphous silicon) on the semiconductor layer 130a. There may be no substantial boundary between the semiconductor layer 130a and the additional semiconductor layer 130b, and the semiconductor layer 130a (including the doped layer 131a) and the additional semiconductor layer 130b together may form a substantially single semiconductor layer (i.e., a combined semiconductor layer).

Subsequently, the semiconductor layer 130a (including the doped layer 131a) and the additional semiconductor layer 130b are crystallized to form a polycrystalline silicon semiconductor layer. A crystallization method may include an annealing process using a heat source such as an excimer laser.

Subsequently, referring to FIG. 12 and FIG. 13, a mask pattern may be provided on the crystallized semiconductor layer, and the crystalized semiconductor layer (partially covered by the mask pattern) may be etched to form the semiconductor layer 130. The semiconductor layer 130 may include the patterned semiconductor layer 130a (including a doped bottom portion 131 or carbon-containing unit 131) and the patterned additional semiconductor layer 130b.

Subsequent process steps may be the same as or similar to process steps described with reference to some of FIG. 4 to FIG. 6 and/or some of FIG. 7 to FIG. 9. The subsequent process steps may include at least two carbon doping steps for the side portions and upper edge portions of the semiconductor layer 130.

Consequently, referring to FIG. 6 and FIG. 14, the first additional horizontal portion 133c and the second additional horizontal portion 135c are formed at lower edges of the first insulating layer 140; or referring to FIG. 9 and FIG. 15, the first additional horizontal portion 133c and the second additional horizontal portion 135c may not be formed. Each of FIG. 14 and FIG. 15 may illustrate a structure of a thin film transistor and/or a thin film transistor array substrate.

The structure of the thin film transistor included in the thin film transistor array substrate shown in FIG. 14 is substantially the same as the structure of the thin film transistor shown in FIG. 6, but the semiconductor layer 130 illustrated in FIG. 14 includes the bottom portion 131 doped with carbon and positioned at an interface with the buffer layer 120.

A concentration of carbon doped in the bottom portion 131 is higher than those of the channel region 134 and the conductive regions 133d and 135d of the semiconductor layer 130. In the semiconductor layer 130, carbon may not be substantially doped in the channel region 134 and the conductive regions 133d and 135d, but only the edge portions 133 and 135 and the bottom portion 131 may be substantially doped with carbon.

The bottom portion 131 may be formed from a lowermost surface of the semiconductor layer 130 up to a predetermined thickness, and may be in contact with the entire lower surfaces of the channel region 134, the first vertical portion 133a, and the second vertical portion 135a. The bottom portion 131 may include the entire bottom surface of the semiconductor layer 130 to which it belongs.

The structure of the thin film transistor included in the thin film transistor array substrate shown in FIG. 15 is substantially the same as the structure of the thin film transistor shown in FIG. 1 or FIG. 9, but the semiconductor layer 130 illustrated in FIG. 15 includes the bottom portion 131 doped with carbon and positioned at an interface with the buffer layer 120.

The characteristics of the bottom part 131 shown in FIG. 15 may be the same as those of the bottom portion 131 shown in FIG. 14.

Referring to FIG. 14 and FIG. 15, the bottom portion 131 doped with carbon and the edge portions 133 and 135 together form a container that substantially surrounds/encloses the channel region 134, the conductive region 133d, and the conductive 135d except for the upper surface of the channel region 134. The container may effectively block an impurity such as boron of the semiconductor layer 130 from being undesirably diffused beyond the semiconductor layer 130 to other thin film transistors.

A thin film transistor, a thin film transistor array substrate, and a related manufacturing method according to one or more embodiments are described with reference to FIG. 16 and FIG. 17 together with the previously described FIG. 1 to FIG. 6.

Figure 16:
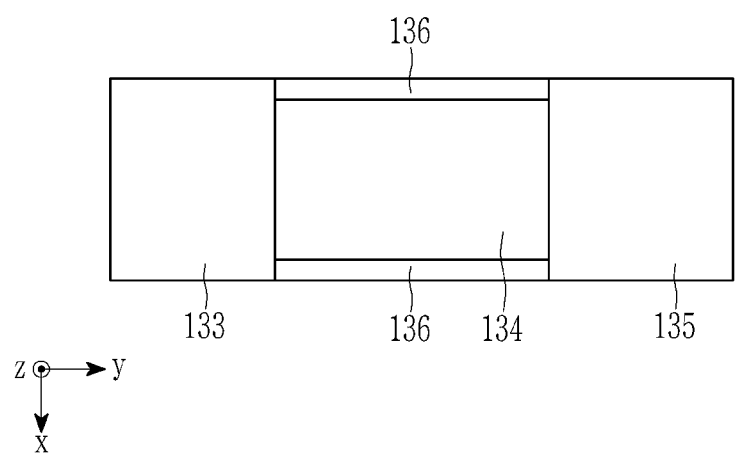
FIG. 16 illustrates a top plan view of a thin film transistor according to an embodiment.
Figure 17:
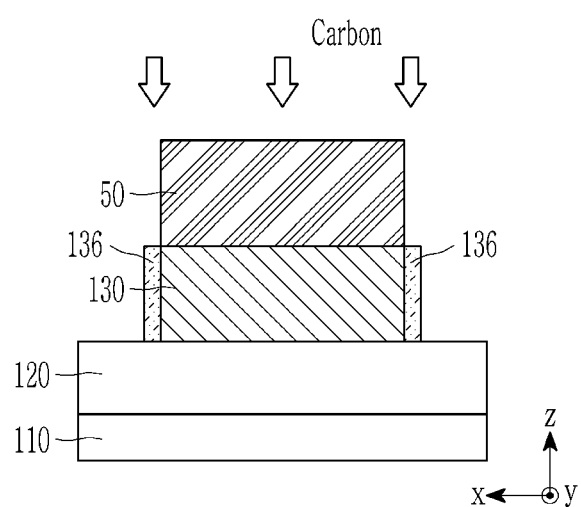
FIG. 17 illustrates a cross-sectional view of a structure corresponding to a process step of a method for manufacturing a thin film transistor array substrate according to an embodiment.

FIG. 16 illustrates a top plan view of a thin film transistor according to an embodiment. FIG. 17 illustrates a cross-sectional view of a structure corresponding to a process step of the method to an embodiment.

Referring to FIG. 16, the thin film transistor may be the same as the thin film transistor shown in FIG. 1 and FIG. 2, but the semiconductor layer shown in FIG. 16 may further include side portions 136 positioned at opposite sides of the channel region 134 that are opposite in the x-direction. The side portions 136 may be positioned between the first and second conductive regions 133d and 135d in the y-direction. Each of the side portions 136 may extend lengthwise in the y-direction.

The side portions 136 may have a higher concentration of doped carbon compared with the channel region 134, for blocking boron potentially diffused from the channel region 134. The concentration of carbon doped in the side portions 136 may be lower than the concentration of carbon doped in the edge portions 133 and 135. A carrier concentration of the side portion 136 may be lower than a carrier concentration of the conductive regions 133d and 135d.

The gate electrode 154 may be positioned on the side portions 136 and may overlap the side portions 136 in the z-direction.

The method for manufacturing the thin film transistor array substrate including the thin film transistor shown in FIG. 16 is substantially the same as the method described with reference to FIG. 3 to FIG. 6, but in the process step shown in FIG. 4, when a portion of the side portion of the mask pattern 50 is removed, four sides of the semiconductor layer 130 may be exposed without being covered by the mask pattern 50. Not only two opposite sides of the semiconductor layer 130 opposite each other in the y-direction (shown in FIG. 4) but also two opposite sides of the semiconductor layer 130 opposite each other in the x-direction shown in FIG. 17 may be exposed without being covered by the mask pattern 50. The four exposed sides of the semiconductor layer 130 may form a closed shape such as a quadrangle.

Subsequently, when carbon is primarily injected from above the mask pattern 50, carbon is doped in the four exposed sides of the semiconductor layer 130, so that not only the first vertical portion 133a and the second vertical portion 135a (shown in FIG. 4) but also the side portions 136 shown in FIG. 17 may also be formed. The first vertical portion 133a, the second vertical portion 135, and the side portions 136 may be connected to each other to form a single closed figure in a plan view of the semiconductor layer 130.

Subsequent process steps may be the same as some process steps described with reference to FIG. 5 and FIG. 6.

In the semiconductor layer 130, the first horizontal portion 133b and the second horizontal portion 135b described above may be optional. The secondary carbon doping process for forming the first horizontal portion 133b and the second horizontal portion 135b may be optional.

Figure 18:
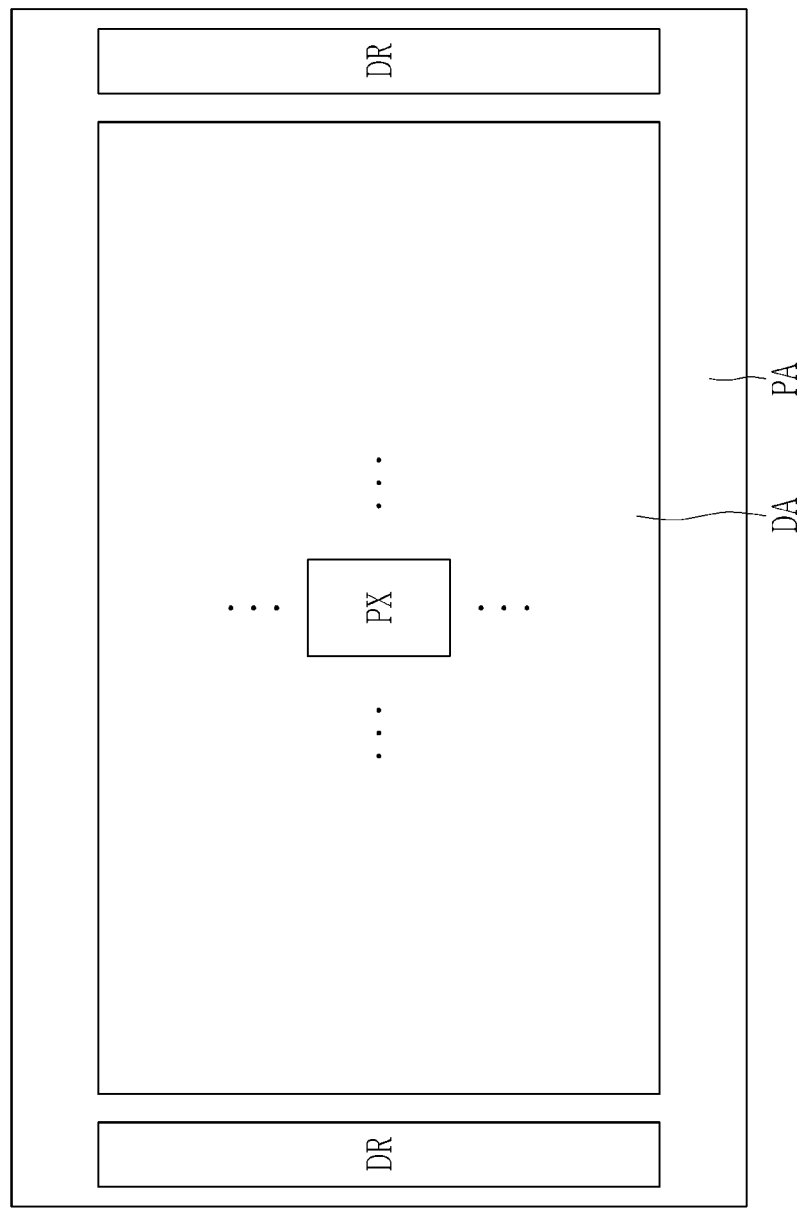
FIG. 18 illustrates a schematic top plan view of a display device according to an embodiment.

FIG. 18 illustrates a schematic top plan view of a display device according to an embodiment.

Referring to FIG. 18, the display device may include a display area DA (including a plurality of pixels PX) and a peripheral area PA around the display area DA. A driving circuit DR for driving the pixels PX may be positioned in the peripheral area PA.

The display device may include a thin film transistor array substrate described with reference to one or more of FIG. 1 to FIG. 17. Each pixel PX and/or the driving circuit DR may include a thin film transistor described with reference to one or more of FIG. 1 to FIG. 17.

When the resolution of the display device is high, when high-speed driving is required, and/or when variable frequency driving is required, a short-channel thin-film transistor having a shorter channel length may be required in the display device. Embodiments may prevent doped impurities (e.g., boron) in the semiconductor layer from diffusing into other layers or other thin film transistors. Therefore, characteristics of thin film transistors in the display device may be sufficiently consistent and/or sufficiently uniform. Advantageously, the performance of the display device may be satisfactory.

While examples of embodiments have been described, practical embodiments are not limited to the described embodiments. Practical embodiments cover various modifications and equivalent arrangements within the scope of the appended claims. doped layer.

What is claimed is:

1. A transistor substrate, comprising:
a substrate;
a semiconductor layer overlapping the substrate; and
a gate electrode overlapping the semiconductor layer,
wherein the semiconductor layer includes a channel region, a conductive region directly connected to an end of the channel region, and an edge portion positioned at an edge of the conductive region, and wherein a carbon concentration of the edge portion is higher than each of a carbon concentration of the channel region and a carbon concentration of the conductive region,
wherein an upper surface of the channel region is level with an upper surface of the edge portion,
wherein the semiconductor layer further includes a bottom portion positioned between the substrate and the channel region, and wherein a carbon concentration of the bottom portion is higher than each of the carbon concentration of the channel region and the carbon concentration of the conductive region.

2. The transistor substrate of claim 1, wherein the edge portion includes a first member directly contacting a first face of the conductive region, wherein the conductive region is positioned between the first member and the channel region.

3. The transistor substrate of claim 2, wherein the edge portion further includes a second member directly contacting a second face of the conductive region, wherein the conductive region is positioned between the second member and the substrate.

4. The transistor substrate of claim 3, wherein the first member and the second member are directly connected to each other.

5. The transistor substrate of claim 3, wherein a first dimension of the second member in a direction perpendicular to the substrate is smaller than a first dimension of the first member in the direction perpendicular to the substrate, and wherein a second dimension of the second member in a direction parallel to the substrate is larger than a second dimension of the first member in the direction parallel to the substrate.

6. The transistor substrate of claim 3, further comprising:
an insulating layer positioned on the gate electrode and including an opening; and
an electrode partially positioned on the insulating layer, partially positioned inside the opening, and directly contacting the second member of the edge portion.

7. The transistor substrate of claim 3, further comprising an insulating layer positioned between the semiconductor layer and the gate electrode and including a carbon-doped portion that directly contacts the second member.

8. The transistor substrate of claim 4, wherein the second member directly contacts the channel region.

9. The transistor substrate of claim 1, wherein the channel region, the edge portion, and the bottom portion together surround the conductive region, and wherein the bottom portion directly contacts an entire face of the channel region.

10. The transistor substrate of claim 1, wherein the edge portion is electrically conductive.

11. The transistor substrate of claim 1, wherein the semiconductor layer includes polycrystalline silicon.

12. A transistor substrate, comprising:
a channel region;
a conductive region doped with a first material and directly contacting an end of the channel region;
an edge region doped with a second material different from the first material, overlapping the conductive region, and directly contacting the end of the channel region, wherein an upper surface of the channel region is level with an upper surface of the edge region; and
a bottom portion positioned below the channel region, wherein a carbon concentration of the bottom portion is higher than each of the carbon concentration of the channel region and the carbon concentration of the conductive region.

13. The transistor substrate of claim 12, wherein the first material includes boron.

14. The transistor substrate of claim 13, wherein the second material includes carbon.

15. An electronic device, comprising:
a display area including a plurality of pixels; and
a driving circuit for driving the plurality of pixels, wherein
the display area comprises:
a substrate;
a semiconductor layer overlapping the substrate; and
a gate electrode overlapping the semiconductor layer,
wherein the semiconductor layer includes a channel region, a conductive region directly connected to an end of the channel region, and an edge portion positioned at an edge of the conductive region, and wherein a carbon concentration of the edge portion is higher than each of a carbon concentration of the channel region and a carbon concentration of the conductive region,
wherein an upper surface of the channel region is level with an upper surface of the edge portion
wherein the semiconductor layer further includes a bottom portion positioned between the substrate and the channel region, and wherein a carbon concentration of the bottom portion is higher than each of the carbon concentration of the channel region and the carbon concentration of the conductive region.

16. The electronic device of claim 15, wherein the edge portion includes a first member directly contacting a first face of the conductive region, wherein the conductive region is positioned between the first member and the channel region.

* * * * *